United States Patent
King et al.

(10) Patent No.: US 10,890,961 B2
(45) Date of Patent: Jan. 12, 2021

(54) METHOD, POWER MONITOR MICROCONTROLLER, AND APPARATUS OF NON-LINEAR COMPENSATION AND MONITORING OF POWER FOR POWER SUPPLY UNITS

(71) Applicant: Microchip Technology Incorporated, Chandler, AZ (US)

(72) Inventors: Craig L. King, Tucson, AZ (US); Adrian-Nicolae Toader, Bucharest (RO)

(73) Assignee: MICROCHIP TECHNOLOGY INCORPORATE, Chandler, AZ (US)

( * ) Notice: Subject to any disclaimer, the term of this patent is extended or adjusted under 35 U.S.C. 154(b) by 184 days.

(21) Appl. No.: 14/315,889

(22) Filed: Jun. 26, 2014

(65) Prior Publication Data

US 2015/0006941 A1 Jan. 1, 2015

Related U.S. Application Data

(60) Provisional application No. 61/840,989, filed on Jun. 28, 2013.

(51) Int. Cl.
*G06F 1/32* (2019.01)
*G06F 1/3206* (2019.01)
(Continued)

(52) U.S. Cl.
CPC ......... *G06F 1/3206* (2013.01); *G01R 21/133* (2013.01); *G01R 31/40* (2013.01);
(Continued)

(58) Field of Classification Search
CPC ............................ G01R 21/133; G01R 35/005
See application file for complete search history.

(56) References Cited

U.S. PATENT DOCUMENTS 6,031,299 A * 2/2000 Stumfall ............... H02M 1/12
307/105
6,316,920 B1 * 11/2001 Huggett ................. G05F 1/70
323/207
(Continued)

FOREIGN PATENT DOCUMENTS

WO 2013/065328 A1 5/2013 ............. G01R 11/00

OTHER PUBLICATIONS

Bertrand Revol, James Roudet, Jean-Luc Schanen, Philippe Loizelet. EMI Study of Three-Phase Inverter-Fed Motor Drives. IEEE Transactions on Industry Applications, Institute of Electrical and Electronics Engineers, 2011, 47 (1), pp. 223-231. <hal-00578202> (Year: 2011).*

(Continued)

*Primary Examiner* — Danny Chan
(74) *Attorney, Agent, or Firm* — Slayden Grubert Beard PLLC

(57) ABSTRACT

A power monitor is used to estimate the amount of input power that is supplied to a power supply. The power monitor is protected by an EMI filter within the power supply. The power monitor measures a line frequency and a line voltage within the power supply and it also retrieves empirically derived coefficient values from memory where the coefficient values are used in formulas that have been determined to model the non-linear behavior of voltage and current in the power supply. The formulas are used to estimate the discrepancy between input power to the power supply and observed power values at a power monitor. The formulas used by the power monitor calculate power compensation factors based on the measured line frequency, the measured line voltage and the retrieved formula coefficient values. The power compensation factors are used to estimate the input power supplied to the power supply.

12 Claims, 5 Drawing Sheets

(51) Int. Cl.
  *G01R 31/40* (2020.01)
  *G01R 35/00* (2006.01)
  *G01R 21/133* (2006.01)
  *H02M 1/42* (2007.01)

(52) U.S. Cl.
  CPC ............ *G01R 35/005* (2013.01); *H02M 1/42* (2013.01); *H02M 1/4225* (2013.01); *Y02B 70/10* (2013.01)

(56) References Cited

U.S. PATENT DOCUMENTS

| | | | | |
|---|---|---|---|---|
| 6,424,234 | B1* | 7/2002 | Stevenson | A61N 1/3752 333/182 |
| 2004/0257747 | A1* | 12/2004 | Stevenson | A61N 1/3754 361/302 |
| 2006/0115279 | A1* | 6/2006 | Moran | H04B 10/502 398/182 |
| 2008/0061729 | A1* | 3/2008 | Nguyen | H02P 21/14 318/799 |
| 2008/0315852 | A1 | 12/2008 | Jayaraman et al. | 323/285 |
| 2009/0306914 | A1 | 12/2009 | Cohen | 702/60 |
| 2011/0103459 | A1* | 5/2011 | Esmailian | H04L 25/03146 375/233 |
| 2012/0281433 | A1 | 11/2012 | Yamanaka | 363/13 |
| 2014/0028284 | A1 | 1/2014 | Lin et al. | 324/76.41 |
| 2014/0052394 | A1* | 2/2014 | Sun | G01R 35/005 702/61 |
| 2014/0103878 | A1* | 4/2014 | Albertson | H02J 3/1828 320/127 |
| 2014/0236371 | A1 | 8/2014 | Ishihara et al. | 700/293 |

OTHER PUBLICATIONS

Zhong Ye and Bosheng Sun. Advanced Digital Controls Improve PFC Performance. 2012. Texas Instruments Incorporated. TI Literature No. SLUP310 (Year: 2012).*

Mather, Barry A. et al., "Input Power Measurement Techniques for Single-Phase Digitally Controlled PFC Rectifiers," Applied Power Electronics Conference and Exposition, IEEE, 7 pages, Feb. 15, 2009.

Sun, Bosheng, "Low-Cost Solution for Measuring Input Power and RMS Current," Analog Applications Journal, vol. 4Q, Texas Instruments Incorporated, URL: http://www.ti.com/lit/an/slyt545/slyt545.pdf, 6 pages, Oct. 1, 2013.

International Search Report and Written Opinion, Application No. PCT/US2014/044503, 13 pages, dated Oct. 23, 2014.

Chinese Office Action, Application No. 201480041161.3, 12 pages, dated Jan. 30, 2018.

\* cited by examiner

METHOD, POWER MONITOR MICROCONTROLLER, AND APPARATUS OF NON-LINEAR COMPENSATION AND MONITORING OF POWER FOR POWER SUPPLY UNITS

CROSS-REFERENCE TO RELATED APPLICATIONS

This application claims the benefit of U.S. Provisional Application No. 61/840,989 filed on Jun. 28, 2013, which is incorporated herein in its entirety.

TECHNICAL FIELD

The present disclosure relates to a power supplies, in particular to power monitoring system used in conjunction with power supplies.

BACKGROUND

Power supply units (PSU) are found in a wide variety of electronic devices. In addition to delivering power, modern devices are increasingly intelligent and seek to gather and report data regarding operating parameters of the power supply. One parameter of particular interest is the quantity of power that is provided as an input to the PSU from a power source. Consequently, many devices incorporate power monitors that measure the amount of power delivered to the input of the PSU.

One problem with conventional power monitoring systems is providing accurate measurements of the power delivered to the PSU while still protecting the power monitoring circuitry from harmful voltage perturbations in the power supply. Electronic devices commonly include EMI (electromagnetic interference) filters to protect the device against voltage perturbations such as voltage spikes, lighting strikes and electrostatic discharge. In order to protect a device from such occurrences, an EMI filter is typically located at the input of the power supply input to the electronic device. Any component located after the EMI filter is protected by the filter. But, any component placed prior to the filter is not protected. Designers are thus faced with the choice of placing the power monitor circuitry external to the EMI filter, which would subject the monitor to damage from EMI, or after the EMI filter. Designers would prefer to place the power monitor circuitry after the EMI filter in order to protect it, but this topology hampers the ability to accurately measure the quantity of power that is being delivered by the power supply.

Various types of EMI filters are known in the art, but an EMI filter typically includes one or more capacitors and inductors. In order for a power monitor device to accurately measure the input power supply from within the protection provided by an EMI filter, the power monitor must compensate for the effects of the EMI filter, in particular its capacitors and inductors. In addition to an EMI filter, two other components typically found in a PSU are a PFC (power factor correction) device and a rectifier. At light loads, a PFC and a rectifier exhibit nonlinear behavior with respect to power. Due to this nonlinearity, conventional power monitors are unable to accurately determine the amount of current flowing through these elements that comprise the EMI filter.

Designers of power supply units demand better performance for power monitoring in power supply units (PSU), in particular at light loads. Conventional systems have been unable to compensate for the effects of an EMI filters such that accurate power monitors can be located within the protection provided by the EMI filter. When located internal to the EMI filter, the accuracy of conventional power monitoring devices at light loads ranges from 1% up to 10% error. Consequently, a need is present for a power monitor that can accurately compensate for the effects of an EMI filter, especially under light loads.

SUMMARY

According to various embodiments, a method can be provided that allows obtaining higher measurement accuracy for power monitoring systems inside a power supply, especially at light loads.

According to an embodiment, a power monitor estimates the input power supplied to a power supply, where the power monitor: measures a line frequency within the power supply; measures a line voltage within the power supply; retrieves formula coefficient values from a memory wherein the coefficient values indicate a relationship between the input power to the power supply and observed power values at a power monitor within the power supply; and calculates power compensation factors based on the measured line frequency, the measured line voltage and the retrieved formula coefficient values.

According the further embodiments, the power supply comprises an EMI filter and wherein line frequency and line voltage are measured at locations within the power supply that are protected by the EMI filter. According the further embodiments, the calculation of power compensation factors utilizes formulas that model non-linear responses of the power supply to changes in the input power to the power supply. According the further embodiments, the power monitor calculates an estimate of the input power to the power supply based on the power compensation factors and a power value that is measured at a location within the power supply that is protected by the EMI filter. According the further embodiments, formula coefficient values are derived by modeling the relationship between changes in the input power to the power supply and the measured line frequency and the measured line voltage; and the formula coefficient values are stored to a non-volatile memory. According the further embodiments, the formulas that model the non-linear responses of the power supply calculate the change in the active power gain at the power monitor as a function of the measured line frequency and calculate the change in frequency offset of the active power at the power monitor as a function of the measured line voltage. According the further embodiments, the calculation of the change in the active power gain at the power monitor further comprises retrieving a formula coefficient value based on the measured line frequency wherein the retrieved formula coefficient value compensates for variations in the active power gain at the power monitor at the measured line frequency.

According to a further embodiment, a power monitor estimates the current drawn by the power supply, where the power monitor: measures a line frequency within a power supply; measures a line voltage within the power supply; retrieves formula coefficient values from a memory wherein the coefficient values reflect the relationship between input power to the power supply and observed power values at a power monitor within the power supply; and calculates current compensation factors based on the measured line frequency, the measured line voltage and the retrieved formula coefficient values.

According the further embodiments, the calculation of current compensation factors utilizes formulas that model non-linear values of the current drawn by the power supply. According the further embodiments, the power monitor calculates an estimate of the input current to the power supply based on the current compensation factors and a current value that is measured at a location within the power supply that is protected by the EMI filter. According the further embodiments, the formulas used to model the non-linear values of the current drawn by the power supply calculate the change in the RMS current gain at the power monitor as a function of the measured line frequency and calculate the change in RMS current offset at the power monitor as a function of the measured line voltage and the line frequency. According the further embodiments the calculation of the change in the RMS current gain at the power monitor further comprises: retrieving a formula coefficient value from a memory location based on the measured line frequency wherein the retrieved formula coefficient value compensates for variations in the active power gain at the power monitor at the measured line frequency.

DETAILED DESCRIPTION

Figure 1:
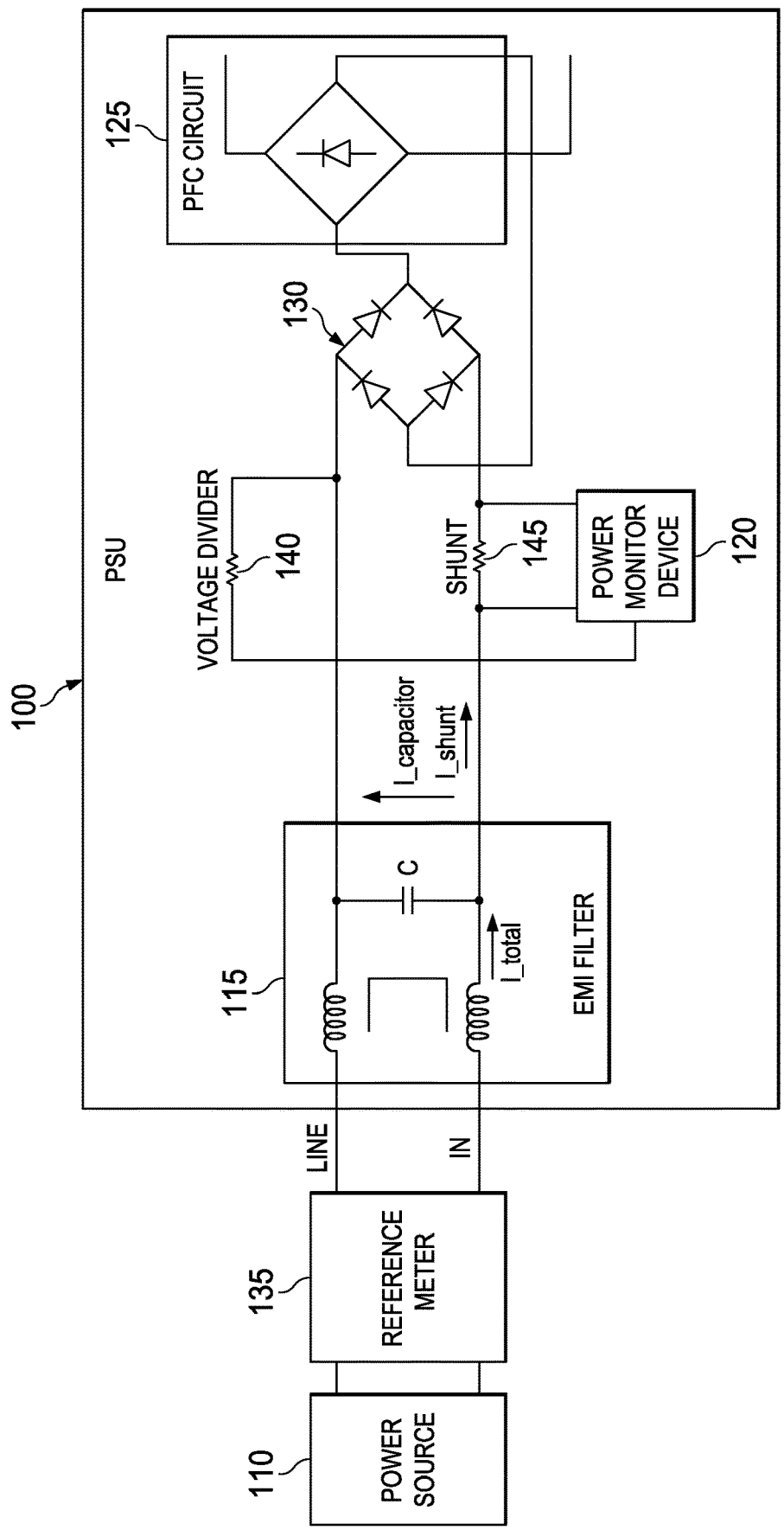
FIG. 1 depicts a power supply unit that includes a power monitor device according to certain embodiments.

FIG. 1 is a high-level schematic diagram of a system according to various embodiments. This system is comprised of a power supply unit (PSU) 100 that receives power from a power source 110. In various embodiments, the power source 110 is an AC power source. The AC power source may be mains electricity provided by a general-purpose, residential power supply, which in the United States supplies approximately 120 volts. Despite the fact that approximate voltage supplied by a residential power supply is closely regulated, the actual voltage that is supplied can fluctuate considerably. In order to assess the operational behavior of a PSU, it is desirable that a power monitor device measure these fluctuations in the input power supply to the PSU.

According to various embodiments, the PSU 100 is comprised of an EMI filter 115, a power monitor device 120, a PFC (power factor correction) circuit 125 and a rectifier 130. As described above, the power monitor device 120 seeks to provide accurate measurements of the input power provided by the power source 110. Ideally, the power monitor device 120 would reside external to the PSU 100 in order to measure the input from the power source 100 prior to any distortion by components that comprise the PSU 100. In this ideal scenario, the power monitor device would be placed at the location of reference power meter 135 in FIG. 1. However, placing the power monitor device 120 outside the PSU 100 results in leaving the power monitor without the protection of the EMI filter 115 and thus susceptible to damage due to perturbations in the output of the power source 110. Thus, the goal of the power monitor device 120 is to obtain measurements of the input from the power source 100 as if those measurements were taken at the location of a reference power meter 135, even though the power monitor is located within the PSU 100 after the EMI filter 115.

FIG. 1 illustrates the placement of the power monitor device 120 within the PSU 100. As described, power source 100 supplies power to PSU 100. The input power supplied to the PSU is then filtered by an EMI filter 115 to eliminate potentially damaging fluctuations in the power supply that are potentially damaging to the components the comprise the PSU 100. Even though the input power may be supplied by a regulated residential power source, spikes in the voltage supplied by the power supply are still relatively common occurrences due to lighting strikes and other perturbations in the electrical supply system. In addition, high-frequency harmonic currents are known to occur in power sources due to distorting current loads located elsewhere on the circuit that operate using high-frequency switched power supplies. EMI filters are known in the art and designed to suppress these spikes and high-frequency harmonics in the input supply voltage. EMI filters typically include one or more capacitors that impede high-frequency harmonic currents and inductors that limit spikes in the input voltage. Placement of power monitor 120 after EMI filter 115 is complicated by these capacitors and inductors that comprise the EMI filter because these capacitors and inductors exhibit non-linear responses to changes in power.

In various embodiments, PSU 100 will include a rectifier circuit 130. A rectifier is commonly used to convert input AC current into the DC current required by the electronic device that is supplied power by the PSU. Various rectifier circuits are known in the art. A common trait of rectifier circuits is that that they distort the current that is drawn from the power source. In order to counteract this distortion created by the rectifier 130 and to increase the power factor, a PSU also typically includes a power factor correction (PFC) circuit 125. The problem caused by PFC and rectifier is that they each exhibit non-linear behaviors, most notably under light loads. This non-linearity within the PSU reduces the ability of the power monitor device to accurately measure the input power, especially under light loads. PSUs are designed for efficient operation at loads that will be most commonly supplied by the PSU. In order to provide efficient operation at these expected loads, PSUs typically exhibit non-linear power responses at lower loads, in particular when the current flowing through the capacitive and inductive elements of the EMI filter are comparable to the current flowing through the current sensing element or shunt of the PSU.

As illustrated in FIG. 1, PSU 100 includes a power monitor device 120. As described above, the power monitor device 120 must be placed after EMI filter 115 in order to benefit from the protection provided by the EMI filter. According to embodiments, the power monitor device 120 is connected to the PSU 100 using a voltage divider 140 and shunt 145. The voltage divider 140 and shunt 145 serve to divert the load voltage and load current flowing within the PSU 100 through the power monitor device.

Figure 2:
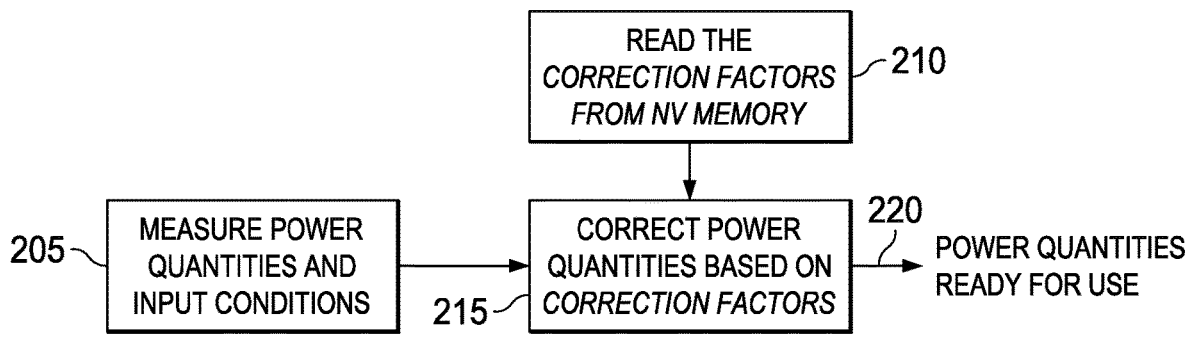
FIG. 2 describes a conventional process for generating power correction factors.

FIG. 2 depicts a conventional approach to implementing a power monitor device that seeks to compensate the error of the input current relative to the value measured by a reference meter, where the fluctuations in current are caused by internal elements of the PSU, such as the rectifier, PFC and EMI filter. In this conventional approach, the power monitor uses a table of correction factors that are used by the power monitor to compensate for the effects of the distorting PSU elements. As depicted at step 205 of FIG. 21, using this conventional power monitor approach, the power monitor receives as inputs the measured power in the PSU as well as other circuit conditions that can be used to choose the correct correction factor. At step 210, the power monitor chooses a correction factor from a table of correction factors stored in non-volatile memory. At step 215, the conventional power monitor device then uses the correction factor retrieved from non-volatile memory to correct the power measured by the power monitor. As step 220, the conventional power monitor device outputs a corrected power output measurement based on the application of the correction factors.

A significant shortcoming of the conventional power monitor device such as described in FIG. 2 is that the correction factors that are utilized are static. The effectiveness of static correction factors hinges greatly on the accuracy of the correction factors. In order to provide accurate corrections, these correction factors must provide corrections that compensate for distorting effects of power system components under a variety of voltage and current conditions. Thus, the difficulty of providing an accurate set of correction factors is compounded in situations where the power supply exhibits non-linear behavior. In order for a table of static correction factors to provide corrections that model such non-linear behavior, the table must grow increasingly large in an attempt to provide sufficient correction factors over the non-linear regions of the PSU's power supply curve. Thus, a table of static correction factors is particularly ill suited for power supplies that utilize multiple non-linear components such as rectifiers, PFC units and EMI filters that individually and in combination introduce multiple non-linear regions in the power supply curve.

Embodiments of the invention improve upon this conventional approach by utilizing correction factors that are dynamically calculated based on the observed voltage and frequency conditions in the PSU. The calculation of correction factors according to embodiments utilizes formulae, described in detail below, that model the non-linear behavior of power supplies.

Figure 3:
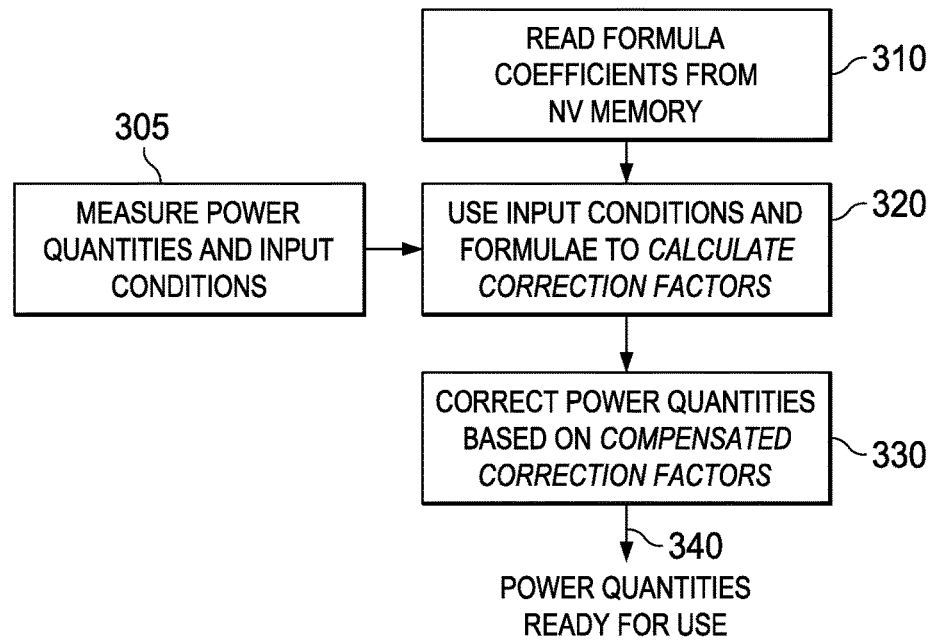
FIG. 3 describes a process by which power correction factors are dynamically calculated according to certain embodiments.

FIG. 3 illustrates the process by which correction factors are dynamically calculated and applied according to embodiments. The dynamic calculation of correction factors begins, at step 305, with the measurement of voltage and frequency conditions in the PSU. In some embodiments, these voltage and frequency measurements may be referred to as the line frequency (f) and the line voltage (V) of the PSU. Once the reference voltage and frequency conditions have been measured, coefficient values for the formulae used for dynamic correction calculation are retrieved from memory at 310.

These coefficient values used by the formulas are empirically obtained for each PSU configuration. These coefficient values describe the dependency between input power applied to the PSU versus internal line voltage and line frequency measurements within the PSU, in particular after the EMI filter. These coefficient values are empirically derived by incrementally modifying the values of the power supply input in order to observe and measure different internal line voltages and line frequencies. Via this process of deriving coefficient values for a particular PSU, the power monitor and the algorithms it employs are calibrated for use. This calibration process can be further improved by running a set of line voltage and line frequency calibrations on multiple PSUs of the same model that are selected from a batch of PSUs. Improved power correction coefficient values can be determined by averaging the coefficient values calculated during the entire set of calibrations on the selected PSUs.

At step 320, the coefficient values retrieved from memory and the line voltage (V) and line frequency (f) input conditions are used to calculate correction factors. As opposed to the conventional use of strictly static correction factors, the invention utilizes the formulas described below that calculate dynamic correction factors that are based on measured voltage and frequency conditions in the PSU. At step 330, the dynamically calculated correction factors are used to generate estimates of the input power to the PSU where these estimates compensate for the distorting effects of the components that comprise the PSU. In this manner the correction factors are dynamically calculated based on measured conditions within the PSU and thus are not static. At step 340, the power monitor can now utilize the calculated input power values.

Figure 4:
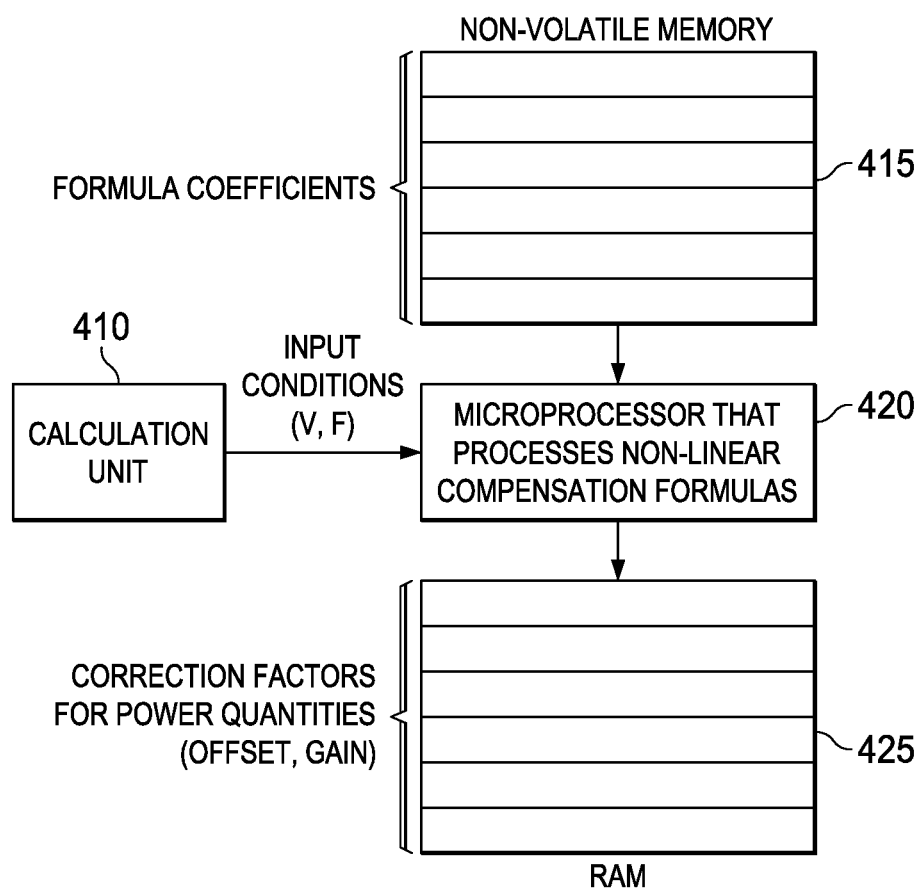
FIG. 4 depicts components of a power monitor device according to certain embodiments.

FIG. 4 depicts components that may comprise the power monitor according to certain embodiments. In some embodiments, the power monitor is a microcontroller. In some embodiments, the power monitor is an electronic device. The power monitor may be comprised of a calculation unit 410 that is capable of measuring the line voltage (V) and the line frequency (f). In certain embodiments, separate sensor units may be provided for measuring the reference line voltage and reference line frequency. The power monitor may also be comprised of non-volatile memory 415 in which the coefficient values are stored.

As described above, the coefficient values are determined via calibration of a particular power monitor and PSU configuration. Once determined, the coefficient values are stored to non-volatile memory 415 and retrieved as needed for use by the non-linear power compensation formulas. Certain embodiments of the power monitor will also include a microprocessor 420 configured to execute the non-linear compensation formulas. The microprocessor receives as inputs the voltage and frequency input conditions collected by the calculation unit 410 and coefficient values retrieved from non-volatile memory 415. The microprocessor uses these coefficient values and voltage and frequency conditions as inputs to the power compensation formulas described below. These calculations by the microprocessor generate power correction factors as outputs. These correction factors are stored to RAM 425, where they can be used to calculate estimates of the power that is received by the PSU. In some embodiments, the power monitor will use these correction factors to calculate the estimated input power values. In some embodiments, the PSU will read the correction factors from RAM to calculate the estimated input power values.

According to embodiments, the power compensation formulas implemented by the power monitor unit are capable of dynamically calculating power correction factors based on observed power conditions within the PSU. These power compensation formulas have been determined to model the non-linear changes in the input power caused by distorting PSU components such as rectifiers and PFCs. The ability of the formulas to model the non-linear power characteristics of the PSU may be confirmed by observing the dependencies between the power values measured at the power monitor and the measured values of the power inputted to the PSU. The power values measured at the power monitor unit are measured after the EMI filter. Concurrently, the values of the power being applied to the total system are also measured. The power values that are measured at the system input and at the power monitor may include RMS current, RMS voltage, active (i.e., real) power and line frequency. The formulas described below have been confirmed to model the non-linear behavior of these power values, especially at light loads.

In order to calculate a power correction factor (P) according to certain embodiments, the following formula may be used:

$$P = GAIN_P(f) \times (P_0 + OFFSET_P(V))$$

where $P_0$ is a raw active power accumulator, $GAIN_P(f)$ is the change in the active power gain at the power monitor as a function of line frequency and $OFFSET_P(V)$ is the change in frequency offset of the active power as a function of the line voltage.

In order to calculate $GAIN_P(f)$ according to embodiments, the following formula may be used:

$$GAIN_P(f) = GAIN_{P,fref}(1 + c_{P,GAIN,f} \times (f - f_{ref}))$$

where f is the measured line frequency, $f_{ref}$ is a reference line frequency, and $C_{P,GAIN,f}$ is a coefficient that compensates for variations in the active power gain at the power monitor as a function of the line frequency. As described above, this coefficient is empirically derived for a particular PSU configuration through a calibration process and stored in non-volatile memory.

In order to calculate $OFFSET_P(V)$ according to embodiments, the following formula may be used:

$$OFFSET_P(V) = c_{P,OFFSET,0} + c_{P,OFFSET,1} \times V + c_{P,OFFSET,2} \times V^2$$

where V is the line voltage and $C_{P,OFFSET,0}$, $C_{P,OFFSET,1}$, $C_{P,OFFSET,2}$ are coefficients of the second order polynomial that compensate for variations in the frequency offset of the active power as a function of the line voltage. As described above, these coefficients are empirically derived for a particular PSU configuration through a calibration process and stored in non-volatile memory.

In addition to calculating correction factors for estimating the input power to the power supply, in some embodiments, the power monitor may also calculate correction factors for estimating the current drawn by the power supply. As with the power correction factors, the power monitor calculates a current correction factor as function of a measured line frequency, a measured line voltage and formula coefficient values that have been empirically derived and stored to memory. In order to calculate a current correction factor (I) used to make such estimates of current, the following formula may be used:

$$I = GAIN_I(f) \times \sqrt{(\Sigma I_0^2)} + OFFSET_I(f,V)$$

where $\Sigma I_0^2$ is a raw squared current accumulator, $GAIN_I(f)$ is the change in the RMS current gain at the power monitor as a function of line frequency and $OFFSET_I(f,V)$ is the change in RMS current offset as a function of the line voltage and line frequency.

In order to calculate $GAIN_I(f)$ according to embodiments, the following formula may be used:

$$GAIN_I(f) = GAIN_{I,fref}(1 + c_{I,GAIN,f} \times (f - f_{ref}))$$

where f is the measured line frequency, $f_{ref}$ is a reference line frequency, $GAIN_{I,Fref}$ is the RMS of the current gain at reference frequency, and $C_{1,GAIN,f}$ is a coefficient that compensates for variations in the RMS current gain at the power monitor as a function of the line frequency. As described above, this coefficient is empirically derived for a particular PSU configuration through a calibration process and stored in non-volatile memory.

Figure 5:
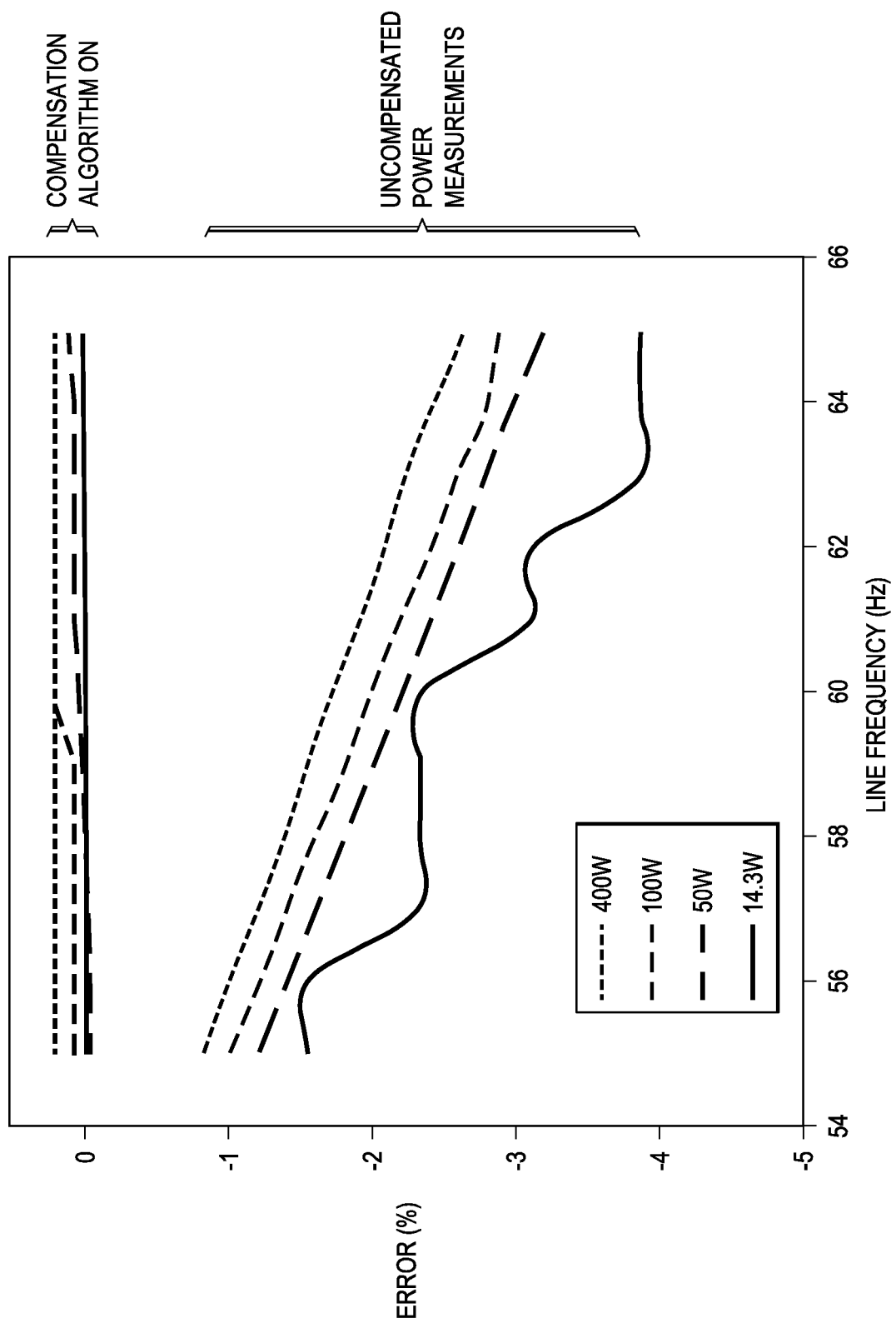
FIG. 5 depicts a comparison in power measurement error rates between embodiments utilizing dynamically calculated power correction factors versus uncorrected power measurements.

In order to calculate $OFFSET_I(f,V)$ according to embodiments, the following formula may be used:

$$OFFSET_I(f,V) = (OFFSET_{I,fref,Vref} \times (1 + c_{1,OFFSET,f}(f - f_{ref})) \times (1 + c_{I,OFFSET,U}(V - V_{ref})))^2$$

where V is the line voltage, f is the line frequency, $V_{ref}$ is a reference line voltage, $f_{ref}$ is a reference line frequency, $OFFSET_{I,Fref,Vref}$ is the RMS current offset at a reference line frequency and reference line voltage and $C_{I,OFFSET,f}$ and $C_{I,OFFSET,V}$ are coefficients that compensates for variations in the frequency offset of the RMS current offset as a function of the line frequency and line voltage, respectively. As described above, these coefficients are empirically derived for a particular PSU configuration through a calibration process and stored in non-volatile memory FIG. 5 depicts two sets of power monitoring data, with one set of data representing the accuracy that is achieved using power correction factors generated using the formulas described above and the second set of data representing power monitor measurements where no correction factors are used. In these trials depicted in FIG. 5, the power monitor was located after the EMI filter, as previously described and also included components within the PSU that introduce non-linear distortions in the power supply. As illustrated in FIG. 5, where no power correction factors are utilized, the magnitude of the error in the power measurements increases as the line frequency increases. For input power to the PSU between 50 W and 400 W, the increase in this uncompensated error increases linearly. However, where PSU is at light loads, such as 14.3 W, the uncompensated error rate increase in a non-linear fashion. As described above, this non-linearity at light loads causes difficulty in accurately compensating for this error.

However, as illustrated in FIG. 5, when the power monitor employs the above formulas to calculate power compensation factors, the power monitor is able to accurately estimate the input power values with minimal error. This ability to generate accurate input power supply estimates is consistent throughout a range of line frequencies and under a range of loads. Thus, FIG. 5 illustrates the ability for power monitor embodiments to accurately model the distorting effect of PSU components and generate accurate correction factors while the power monitor is protected within the PSU by the EMI filter.

Figure 6:
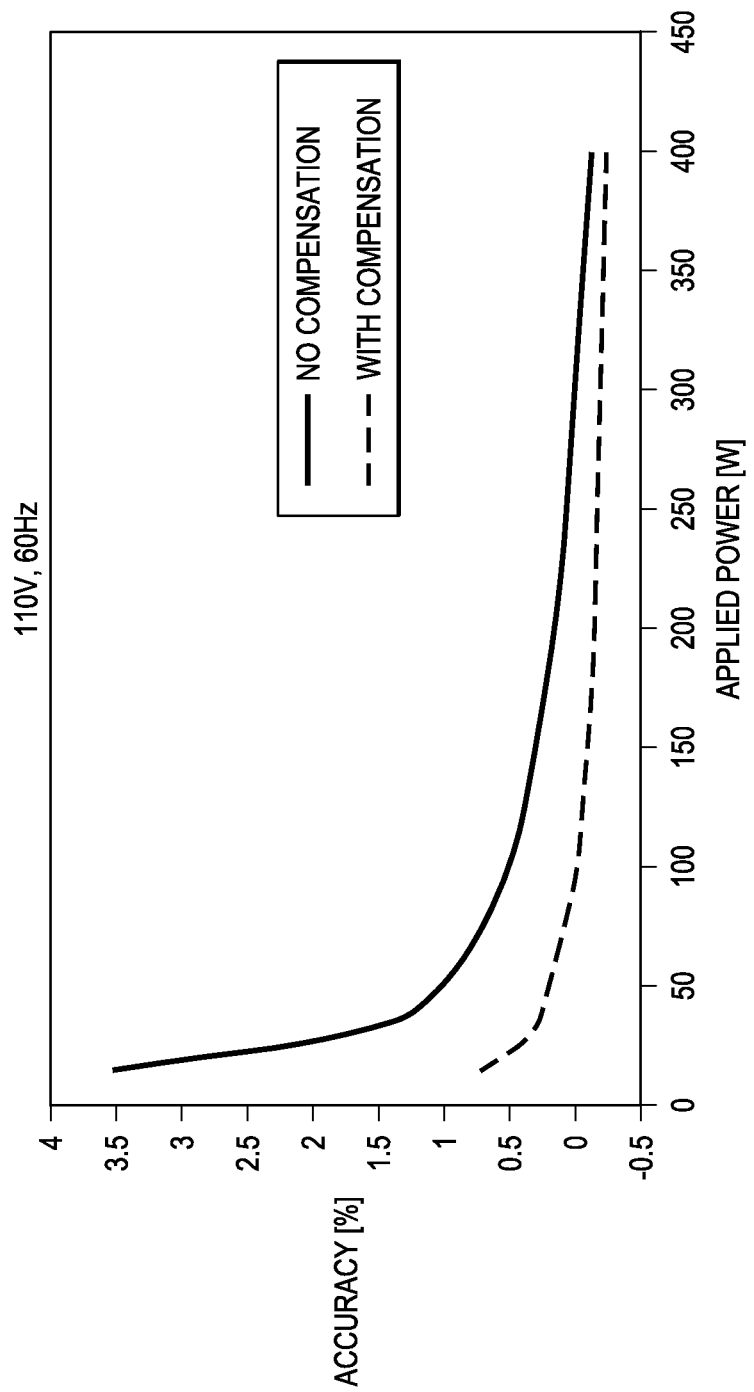
FIG. 6 depicts also depicts a comparison in power measurement error rates between an embodiment utilizing dynamically calculated power correction factors versus uncorrected power measurements.

FIG. 6 again depicts two sets of power monitoring data. As with FIG. 5, FIG. 6 also compares the accuracy of power monitor measurements that have been corrected using compensation factors calculated using the above formulas versus power monitor measurements made with no compensation. FIG. 6 illustrates that over a full range of input power values, a power monitor according to embodiments can generate power input estimates that exhibit significantly improved accuracy. In particular, FIG. 6 illustrates the ability for embodiments utilizing the above dynamic power correction formula to reduce error rates while under light loads. As illustrated, error rates using embodiments are below 1% under even the light loads (e.g., loads less than 50 W), while uncompensated measurements will exhibit error rates from 1% to 3.5% under light loads.

Several advantages result from use of embodiments of the invention. First, the same power monitor firmware can be used to generate correction factors for a variety of PSUs. The power monitor need only be calibrated for each PSU configuration in order to accurately account for differences between PSUs, such as the characteristics of the EMI filters that are used and the topology of components within the PSU. As described above, calibration of the power monitor comprises derivation of coefficient values to be used in the formulas. However, the power monitor firmware that executes the formula can be used for all PSU since the coefficient values generated by calibration are simply inputs to the firmware process where these inputs are retrieved from non-volatile memory. Thus, the firmware used to implement the power monitor correction formulas can be the same for all PSUs.

Another advantage provided by embodiments is the relative simplicity of the compensation formulas that are used. In many situations, attempts to model non-linear systems results in computationally intensive algorithms that are costly to implement. Embodiments on the other hand can be implemented using relatively straightforward calculations that require only low amounts of MCU resources. Further reducing the cost and implementation burden, the formula described above can be efficiently implemented in 8-bit, 16-bit and 32-bit micro controllers because they require only 16×16 bit multiplications, additions and bit shifts.

Another advantage provided by embodiments is the improved accuracy of power estimates that can be provided, especially at light loads. As illustrated in FIG. 5 and FIG. 6, embodiments have been demonstrated to provide corrected input supply measurements that are highly accurate, with error rates less than 1%, even under light loads where the PSU is known to include non-linear distorting effects.

What is claimed is:

1. A method for monitoring input power supplied to a power supply, the power supply including an EMI filter, the method comprising:
    measuring a line frequency within the power supply at a first location protected by the EMI filter;
    measuring a line voltage within the power supply at a second location protected by the EMI filter;
    retrieving formula coefficient values from a memory wherein the coefficient values indicate a relationship between the input power to the power supply and observed power values at a power monitor within the power supply; and
    calculating a plurality of power compensation factors based on the measured line frequency, the measured line voltage and the retrieved formula coefficient values;
    wherein the calculation of power compensation factors utilizes formulas that model nonlinear responses of the power supply to changes in the input power to the power supply, the nonlinear responses of the power supply arising from nonlinear responses in the EMI filter; and
    the method further includes applying the power compensation factors to correct a measurement of input of the power supply;
    wherein the formulas that model the non-linear response of the power supply calculate a change in an active power gain at the power monitor as a function of the measured line frequency and calculate a change in frequency offset of an active power at the power monitor as a function of the measured line voltage.

2. The method according to claim 1, further comprising:
    calculating an estimate of the input power to the power supply based on the power compensation factors and a power value that is measured at a location within the power supply that is protected by the EMI filter.

3. The method according to claim 1, further comprising:
    deriving the formula coefficient values by modeling the relationship between changes in the input power to the power supply and the measured line frequency and the measured line voltage; and
    storing the formula coefficient values to a non-volatile memory.

4. The method according to claim 1, wherein the calculation of the change in the active power gain at the power monitor further comprises:
    retrieving a formula coefficient value based on the measured line frequency wherein the retrieved formula coefficient value compensates for variations in the active power gain at the power monitor at the measured line frequency.

5. The method according to claim 1, wherein the calculation of power compensation factors is further based on a difference between the measured line frequency and a reference frequency.

6. The method according to claim 1, wherein the calculation of power compensation factors is further based on a coefficient that compensates for variations in gain as a function of the measured line frequency.

7. Power monitor microcontroller device for monitoring input power supplied to a power supply comprising:
    an EMI filter;
    a sensor configured to measure a line frequency value and a line voltage value at a location within the power supply protected by the EMI filter;
    a non-volatile memory configured to store coefficients values wherein the coefficient values reflect the relationship between input power to the power supply and power values observed at the power monitor microcontroller within the power supply; and
    a microprocessor configured to:
        calculate power compensation factors based on the measured line frequency, the measured line voltage and the formula coefficient values retrieved from the non-volatile memory;
        calculate a plurality of power compensation factors utilizing formulas that model non-linear responses of the power supply to changes in the input power to the power supply, the non-linear responses of the power supply arising from nonlinear responses in the EMI filter; and
        apply the power compensation factors to correct a measurement of input of the power supply;
    wherein the formulas that model the non-linear responses of the power supply calculate a change in an active power gain at the power monitor as a function of the measured line frequency and calculate a change in frequency offset of an active power at the power monitor as a function of the measured line voltage.

8. The power monitor microcontroller device according to claim 7, wherein the power monitor microcontroller is located within the power supply at a location protected by the EMI filter.

9. The power monitor microcontroller device according to claim 7, wherein the microcontroller is configured to calculate an estimate of the input to the power supply based on the power compensation factors and a power value that is measured at a location within the power supply that is protected by the EMI filter.

10. The power monitor microcontroller device according to claim 7, wherein the calculation of the change in the active power gain at the power monitor further comprises:

retrieving a formula coefficient value from a memory location based on the measured line frequency wherein the retrieved formula coefficient value compensates for variations in the active power gain at the power monitor at the measured line frequency.

11. A method for monitoring input current supplied to a power supply, the power supply including an EMI filter, the method comprising:

measuring a line frequency within a power supply at a first location protected by the EMI filter;

measuring a line voltage within the power supply at a second location protected by the EMI filter;

retrieving formula coefficient values from a memory wherein the coefficient values reflect the relationship between input power to the power supply and observed power values at a power monitor within the power supply;

calculating a plurality of current compensation factors based on the measured line frequency, the measured line voltage and the retrieved formula coefficient values utilizing formulas that model non-linear values of the current drawn by the power supply, the non-linear values of the current drawn by the power supply arising from nonlinear responses in the EMI filter; and applying the current compensation factors to correct a measurement of input of the power supply;

wherein the formulas used to model the non-linear values of the current drawn by the power supply calculate a change in RMS current gain at the power monitor as a function of the measured line frequency and a change in RMS current offset at the power monitor as a function of the measured line voltage and the line frequency;

wherein the calculation of the change in the RMS current gain at the power monitor further comprises retrieving a formula coefficient value from a memory location based on the measured line frequency wherein the retrieved formula coefficient value compensates for variations in the active power gain at the power monitor at the measured line frequency.

12. The method according to claim 11, further comprising:

calculating an estimate of the input current to the power supply based on the current compensation factors and a current value that is measured at a location within the power supply that is protected by the EMI filter.

* * * * *